(12) United States Patent
Arnfield et al.

(10) Patent No.: US 7,139,906 B2
(45) Date of Patent: Nov. 21, 2006

(54) STARTING POINT CONFIGURATION DETERMINATION FOR COMPLEX CONFIGURABLE SYSTEMS

(75) Inventors: David Philip Arnfield, East Hampstead, NH (US); Lawrence Allen Hurst, Jr., Austin, TX (US); Daniel Jack Wingard, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 553 days.

(21) Appl. No.: 10/464,895

(22) Filed: Jun. 19, 2003

(65) Prior Publication Data

US 2004/0260920 A1 Dec. 23, 2004

(51) Int. Cl.
 G06F 15/177 (2006.01)
 G06F 7/00 (2006.01)
(52) U.S. Cl. .............. 713/1; 713/2; 709/220; 709/221; 707/3; 707/4; 714/1
(58) Field of Classification Search ............ 713/1.2; 714/1; 709/220, 221; 707/3, 4
See application file for complete search history.

(56) References Cited

U.S. PATENT DOCUMENTS

| 6,493,751 B1 | 6/1985 | Mori | 455/343 |
|---|---|---|---|
| 6,098,098 A | 4/1988 | Kawasaki et al. | 455/343 |
| 6,412,025 B1 | 2/1990 | Kasa et al. | 455/574 |
| 5,664,170 A | 8/1992 | Toko | 455/76 |
| 5,758,071 A * | 5/1998 | Burgess et al. | 709/220 |
| 6,282,175 B1* | 8/2001 | Steele et al. | 370/254 |
| 6,336,101 B1* | 1/2002 | Dean et al. | 705/29 |
| 2002/0026605 A1* | 2/2002 | Terry | 714/37 |
| 2003/0192039 A1* | 10/2003 | McConnell | 717/171 |

* cited by examiner

*Primary Examiner*—A. Elamin
(74) *Attorney, Agent, or Firm*—Robert H. Frantz; David A. Mims, Jr.

(57) ABSTRACT

A single starting point configuration for a complex, configurable system, is determined by collecting machine-reported data from a configurable system; obtaining non-machine reported configuration information regarding said configurable system from one or more external document applications, merging the machine-reported data and the external document, and producing a proposed configuration starting point. A user may enter additional changes to the system configuration, thereby yielding a highly accurate starting point configuration. Prior to order fulfillment, the final system configuration, change order, and starting point configuration are verified to match and correlate.

18 Claims, 7 Drawing Sheets

STARTING POINT CONFIGURATION DETERMINATION FOR COMPLEX CONFIGURABLE SYSTEMS

CROSS-REFERENCE TO RELATED APPLICATIONS

Claiming Benefit Under 35 U.S.C. 120

This application is related to U.S. patent application Ser. No. 10/346,247, filed on Jan. 16, 2003, by Ping Chen, et al.

FEDERALLY SPONSORED RESEARCH AND DEVELOPMENT STATEMENT

This invention was not developed in conjunction with any Federally sponsored contract.

MICROFICHE APPENDIX

Not applicable.

INCORPORATION BY REFERENCE

The related U.S. patent application Ser. No. 10/346,247, filed on Jan. 16, 2003, by Ping Chen, et al., is hereby incorporated by reference in its entirety including figures.

BACKGROUND OF THE INVENTION

1. Field of the Invention

This invention relates to systems and methods for determining appropriate services and components for configuration changes to complex configurable systems, such as upgrades to computer systems, data communications systems, and the like.

2. Background of the Invention

Many modern technology systems such as computers, web servers, telephone switches, Internet routers, test equipment, manufacturing control systems, etc., are configurable as to their electronic, mechanical and software components. For example, a personal computer is configurable to meet the needs of the user or customer by adding circuit cards (e.g. PCI or EISA graphics cards, LAN interface cards, etc.), additional integrated circuits in sockets (e.g. memories, coprocessors, etc.), software components (e.g. application programs, drivers, utilities, etc.), and even mechanical components (e.g. panels, covers, brackets, etc.). Many products adopt configurable architectures to enable modular assembly techniques, cost reduction, and field upgradability.

As such, many systems are originally delivered by an Original Equipment Manufacturer ("OEM") with "known" configuration. The OEM may retain records as to the configuration of each unit, tracked by order number, customer number, and/or base system serial number, for future reference. For example, a purchaser of a system may request some time after delivery service of a configurable component, or upgrade of the system. In order to accurately fulfill the need, the OEM must consult its records regarding the original configuration of the system, or manually verify the configuration of the system.

Because many of these systems are designed as "open" architectures in which users or third-party companies may perform upgrades and service to various components, a system's configuration may evolve after delivery to a customer or user. Thus, the OEM's configuration records for each such machine become out of date and inaccurate, making it difficult or even impossible to provide accurate and quick fulfillment of upgrade and service needs of the customer. Although this problem is true for many types of computing, electronic, industrial and communications equipment, this situation is especially applicable to computer configurations for personal computers and server computers. In computing parlance, the configuration of a system is often referred to as the "feature content", and the configuration computer platform is often referred to as the "machine".

In order to change the feature content or to process model upgrades to complex configured systems, it is a business requirement to know the current configuration or "starting point" of the target machine to be modified. It is well known that the networked world, with its unprecedented premium on speed, demands a heightened and relentless focus on quality. Attempts to upgrade or replace components which are not successful may result in unnecessary system downtime, expense, and risk.

Some suppliers and service providers of such configurable systems have resorted to manually intensive procedures, wherein a technician visits a site to perform an "inventory" of a system configuration, or the system must be shipped back to a service depot or manufacturer's facilities. For cost and inconvenience reasons, these two approaches are rarely acceptable to many customers.

Some companies such as International Business Machines ("IBM") have instituted use of electronic configuration records, or "installed machine inventory records", which are maintained in a database (or multiple databases) by IBM. However, installed machine inventory records are often inaccurate and an inadequate representation of current customer installed system configurations, due to the ability of parties to make configuration changes and upgrades, especially software modifications, without coordinating with or cooperating with the manufacturer's processes for updating the installed machine inventor records. Business partners may perform upgrades or repairs, the customer may relocate components (e.g. swap components from one machine to another), and other manufacturers may supply upgrades, all "out of the loop" of the process designed to track each machine's configuration.

Concurrently, increased dependencies on Business Partners in support of Manufacturing, Sales, and Service has created greater demand and need for a simple and accurate process to determine the starting configuration of customer installed systems. Configured hardware and software data used to create starting point inputs in the Sales and Manufacturing configuration processes are obtained from multiple sources in today's end-to-end process, and are often inaccurate. As such, manually intensive and costly processes in each service region are still required in an attempt to maintain data integrity of configuration records.

Customers require, over time, to increase computer capacity and function of their computer systems. IBM is somewhat unique in the method presently employed to provide increased capacity and function to systems by using an "MES/upgrade" process, which requires "starting point" input data accuracy. Many competitors in the same market segment have elected to use a "box swap" order process methodology, in which a replacement system is configured to mimic a desired upgraded original system, the replacement system is then installed in place of the original system, and the original system is taken out of service and returned to the manufacturer for recycling of components for other replacement systems. Tracking warranty status of such "swapped" systems is especially difficult, as each "upgrade"

to a customer's system may result in every component of the system being exchanged for components of differing ages, revision level, in-service time, serial numbers, etc.

Additionally, even with a box swap approach, manual configuration verification is often employed to make absolutely certain that the replacement system is an accurate upgrade configuration from the original system's configuration.

An advantage of the IBM MES/Upgrade process is that it provides a systematic process of obtaining installed configuration information via utilization of machine sensed and reported configuration information, also known as Vital Product Data ("VPD"). The MES/Upgrade process benefits over box swapping are in the area of preserving a machine serial number (and serial numbers for components within the system) as part of investment protection offerings (e.g. warranties, service plans, etc.).

VPD information is especially useful for high volume products within IBM. However, the volume of machines sold and deployed through such a successful company as IBM prohibit easy and cost effective collection, storage, and subsequent sharing of this information. For this reason, the VPD information is obtained on an "engagement basis" (e.g. at the time a need is determined such as at the time an upgrade order is placed).

Collection of VPD information can be difficult and incomplete, even with the best available tools designed to semi-automatically collect such information.

The related patent application, which is incorporated herein, addresses a need in the art for a system which more efficiently collects system configuration information on an "engagement basis", in a manner which facilitates and supports high dependency of original equipment manufacturers on business partners and third party vendors, but which avoids adding significant cost, complexity or failure rate to configurable systems, and which avoids intensive manual inventorying activities.

Summary of Related Patent Application—"MRPDClassic"

As described in the related patent application, Machine Reported Product Data—Vital Product Data ("MRPD-VPD") is a re-engineered business process and computing technology implementing that business process which collects, translates, and stores information that uniquely define system components contained within a customer's installed system.

VPD is accurate, machine-reported hardware and software data. Our new MRPD data repository serves as a single source for storing and retrieving the data. MRPD increases the "starting point" input data accuracy through the use of VPD, Vital Product Data. MRPDclassic ("MRPD") is built upon a closed loop integrated business process concept that requires support from multiple product development brands, manufacturing, service providers and each customer. All facets of the closed loop process should be in place in order for the process to be optimally effective.

The MRPD process is a key step in making this data available to system configurators and users. When submitted in an "MRReport" format, the data is used to improve process efficiency by providing a more efficient means of obtaining accurate MES/Upgrade Order starting point information. Thus, use of the present invention provides:

(a) improved data quality;
(b) reduced service expense;
(c) reduced order fulfillment cycle time; and
(d) increased customer satisfaction.

While the primary use of VPD data is as input to the order configuration process by system sales personnel (e.g. Business Partners, enterprise customers, post sales configuration technicians, etc.), manufacturing, engineering support, and service personnel also use this data for a variety of purposes.

Manufacturing departments may use results from the configuration process (e.g "CFReports") to execute each system's manufacturing order, including building the initial system, testing the configuration, and implementing required engineering change processes.

As such, our MRPD process of the related patent application provides existing order processes, such as IBM's own MES/Upgrade process, accurate system configuration information, and addresses the opportunity and need to provide a single world-wide data repository and process, and avoids manually intensive inventories of existing system configurations.

The invention of the related application, which we will now refer to as "MRPDclassic", is a significant advance in making accurate system configuration data available to a Configurator and to other information users. When submitted in a our MRReport format, the data is used to improve process efficiency by providing a more efficient means of obtaining accurate MES Order starting point information.

While a primary use of the data is for input to the configuration process by providing reliable, timely and accurate MES starting point input VPD based configuration data, the Sales and MFG order processes also utilize this data. Sales personnel (Business Partners, enterprise customers, IBM Techline seeking pre-sales, BPSO, CSO, sales order personnel, post-sales configuration) use this data extensively as input into the Front End MES Order configuration process. Manufacturing uses results from the configuration process (CFReports) to execute the Manufacturing order, build, test and engineering change processes.

Vital Product Data, VPD, is accurate machine reported data; however, it does not represent a fully configured system, and its data is only partially used in the configuration process. Therefore, there is a need in the art for a complete solution for the configuration process using VPD data provided from MRPD customer's installed system.

BRIEF DESCRIPTION OF THE DRAWINGS

The following detailed description when taken in conjunction with the figures presented herein provide a complete disclosure of the invention.

SUMMARY OF THE INVENTION

Figure 1:
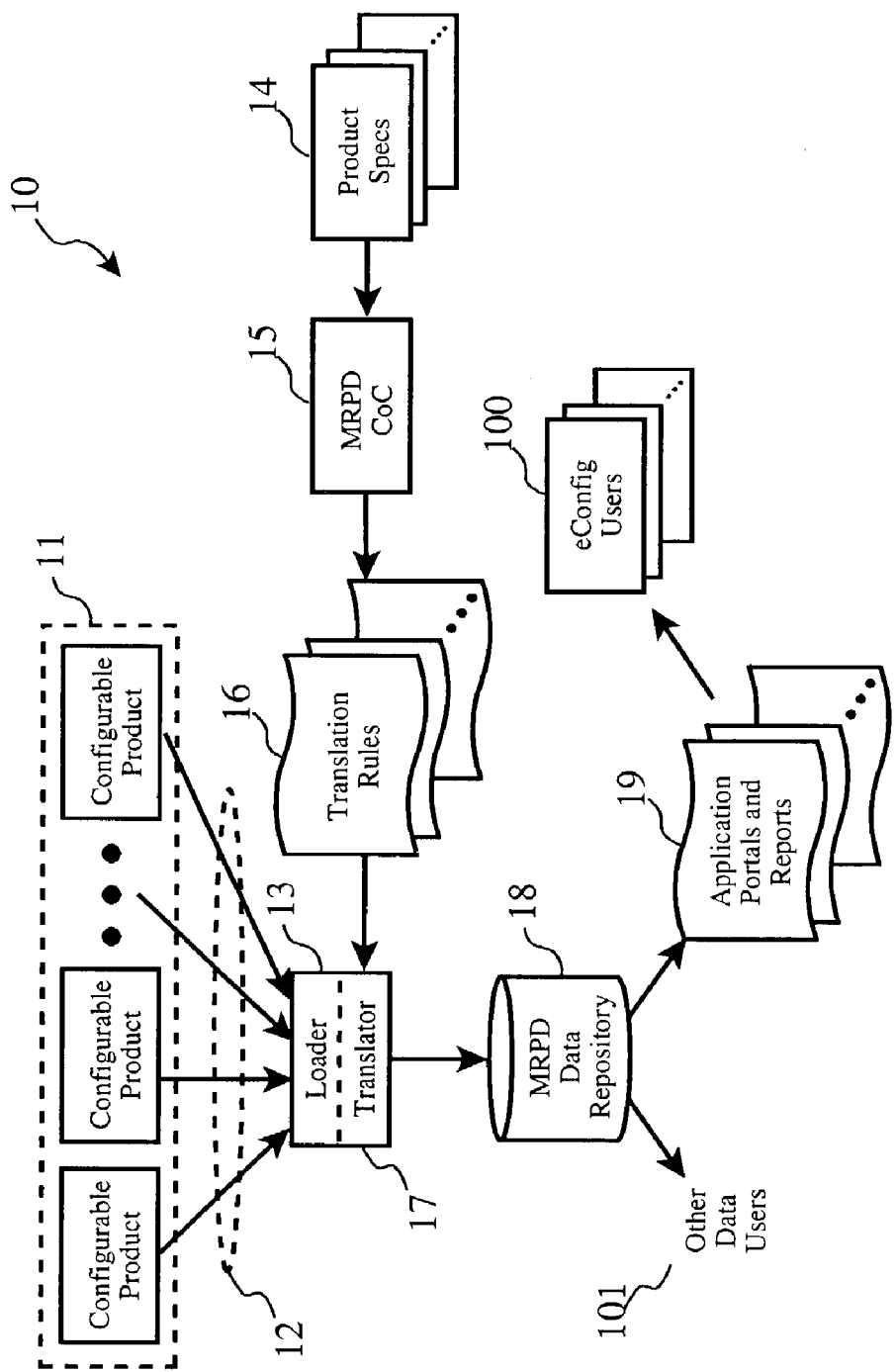
FIG. 1 illustrates the invention of the related patent application from a top-level system perspective.

The system and method of the related patent application, MRPDclassic, provides the basic foundation and is a cornerstone in the framework employed for the present invention, "MRPDplus". MRPDplus provides a complete solution for the configuration process using VPD data provided from MRPD customer's installed system. This allows MRPD to be the single source for reliable, timely and accurate.

MRPDplus is a single worldwide business process which by design consolidates multiple applications and geography specific databases into a single process that supports complex configured hardware configurator starting point input generation.

DESCRIPTION OF THE INVENTION

The present invention, MRPDplus, is preferably realized in conjunction with the system and method of the related patent application, MRPDclassic. As such, we first present details of MRPDclassic for completeness and ease of understanding the present invention.

The Related Invention in Detail: MRPDclassic

A primary objective of our new Machine Reported Product Data ("MRPD") process is to facilitate the creation of a starting point record needed in support of the MES order process, with VPD data accuracy.

Our initial implementation of MRPD supported the IBM MES order process, and in time, other business processes and organizations have found the produced information highly useful and reliable, including Sales Personnel, Manufacturing Logistics, Asset Protection, Service, Engineering & Field Management, and Quality Control.

The most accurate source for current configuration information of a customer installed system is to systematically obtain the hardware/software information needed from the machine itself at the time the information is needed. Enablement of the machine to survey its contents and provide the information, at the time the information is needed, is the preferred means for ensuring data accuracy. Software programs which can inspect or query installed components such as disk drives, subsystem boards, controllers, memory modules, etc., can, on demand, collect a partial inventory of system components, including component model, size, serial number, revision level, manufacturer, installation date, etc., to the extent each component supports such reporting.

Additionally, records may be created on each machine to record some or all of this same information for components which do not support such queries. For example, a mechanical bracket to hold disk drives in a mainframe may be a critical factor in determining if it can receive an additional disk drive unit. Since the bracket is mechanical structure, it could not respond to a software query as to its model, manufacturer, etc. So, a record can be created for the bracket with this information, and stored in a file or database accessible by the resident VPD report generating utility program.

Through coordinated and cooperative efforts between business process and application owners, as well as product development, manufacturing, and data management owners, an end-to-end integrated solution has been developed that is positioned to meet and exceed customer application and business process needs, which supports enhances business process effectiveness, reduces the total cost of system ownership, and improves overall customer satisfaction.

In our exemplary embodiment provided in the related patent application, MRPD has been implemented as an option to IBMLink. IBMLink is a well-known, online service provided by IBM as an OEM to its distributors, business partners, and authorized resellers. IBMLink is a comprehensive information retrieval system which provides a convenient point of electronic access for IBM customers, business partners, alliances, and others. Using IBMLink, information may be obtained regarding IBM products, pricing, product configurations, technical support for hardware and software, and more. Electronic mail, file transfer, publications ordering, and online guides are among the other offerings included on IBMLink. Information and applications on IBMLink are designed to improve customer support and increase productivity for customers and IBM.

IBMLink is partitioned into several service categories, including:
(a) InfoLink for sales manuals, announcements, and catalogs;
(b) OrderLink for system configurators, prices and schedules;
(c) ServiceLink for problem resolution, questions and answers, and preventative service;
(d) MartLink for information service; and
(d) UserFunctions for profiles, IBMLink guides, notes and forms.

Further, as disclosed in the related patent application in our exemplary embodiment, the MRPD services are provided as part of OrderLink within IBMLInk. It will be readily apparent, however, that the present invention may be alternatively realized in conjunction with or independently of other OEM support services and systems, and that the scope of the present invention is not limited to the exemplary embodiment described herein with respect to IBMLink.

The following functions and processes of MRPD have been realized in Sun Microsystem's JAVA [TM] programming language and Object-Oriented Programming ("OOP") methodology in a Java 2 Platform Enterprise Edition ("J2EE") paradigm. The invention was initially implemented in the C programming and procedural programming methodology. While either implementation, or alternate implementations in other methodologies and languages, may be sufficient in certain cases, we believe the platform independence and OOP advantages of implementation in JAVA (e.g. write one, run everywhere) are considerable.

Additionally, the following arrangements and processes have been implemented using the well-known MQSeries and Transmission Control Protocol/Internet Protocol ("TCP/IP") Systems Network Architecture ("SNA") interface protocols, although other suitable choices may be employed within the scope of the present invention.

The following detailed description, then, provides graphical and functional description of functions and interfaces of the related invention, preferably realized as program code such as "C" and/or Java, but equally well realized in any suitable programming language and methodology.

Turning to FIG. 1, a number of configurable systems or configurable products (11) are enabled to perform a self-inventory or self-configuration assessment. Machines such as IBM i-, p-, and zSeries Servers, large Direct Access Storage Devices ("DASD"), tape drives, and printers are all candidates for such enablement, and many of these have already been so enabled in production. Under software command, an operator or user can invoke a routine which gathers the content of the machine by part number. This may include system boards, add-in boards, power supplies, software programs, etc. In the preferred embodiment, these components are Vital Product Data ("VPD") enabled (e.g. they report their characteristics in formats according to the IBM VPD format), but in alternate embodiments, other formats of query-response can be employed. This information preferably includes component make and model identifiers, serial numbers, manufacturing date, revision level, firmware level, etc.

The configurable systems (11) communicate (12) with our MRPD system's loader (13), which receives machine reported configuration data from the configurable systems and determines the machine-native format of the data. This allows each product type to report its data in its own format, and avoids the need to retrofit many different existing machines to be able to report configuration data in a common or universal format.

As each system reports their configuration data, a translator (17) is provided to convert the machine reported configuration data from its native or original format into an MRPD system-wide format, which is preferably in a sales nomenclature format of feature codes typically found in a catalog. This allows upgrades and replacements to be determined directly from the common-format data.

This common-format data is stored in a repository (18), such as a database. This data can then be accessed via application portals and various reports (19) (e.g. MRReports), electronic configuration users (100), and other types of users (101). As this database is preferably accessible from any point on the World-wide Web, it provides a single, comprehensive source of system configuration information with uniform information format, regardless of the system being described and regardless each system's native self-inventory data format.

To accomplish the translation from the machine-native formats from the configurable systems into a common data format, a set of translation rules (16) is employed, which are preferably developed and provided to the system by an MRPD Center of Competence ("CoC") (15) (e.g. the system support and administration team) based upon product specifications (14) for each system type. As configuration data is received (12) from a configurable product (11), the product type is identified so that a translation rule set (13) can be selected and used to translate the data into the MRPD common format for storing in the MRPD repository (18). In alternate embodiments, the translation rules could be provided by vendors, third-parties, and other manufacturers, especially for configurable subsystems within the configuration system.

Figure 2:
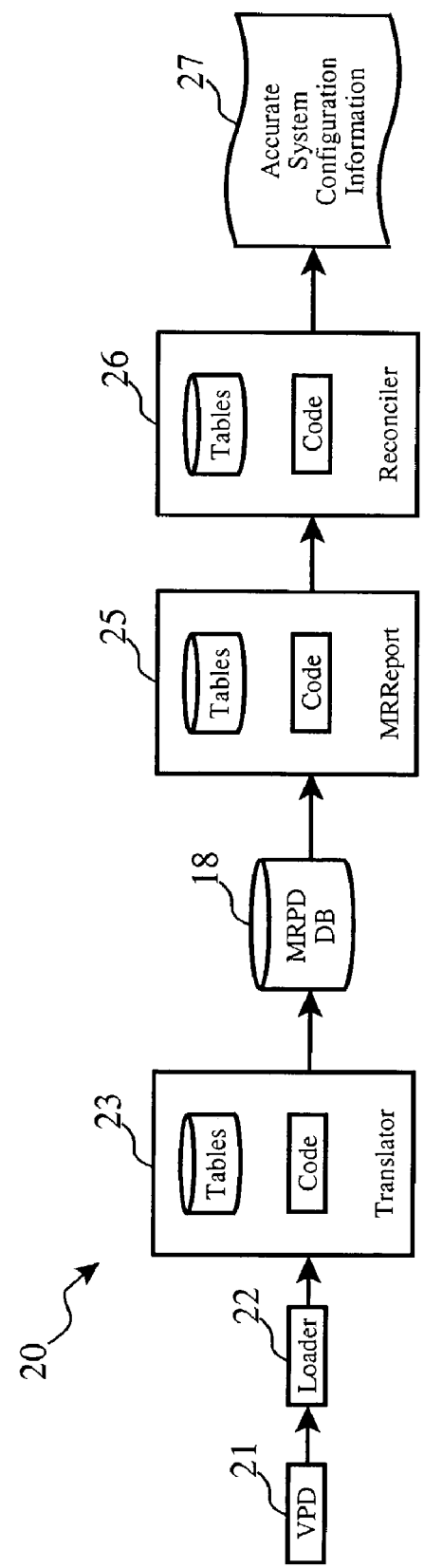
FIG. 2 shows details of the process of the related invention.

Turning now to FIG. 2, more details of the process according to the related invention are shown. The machine reported configuration data (21), such as IBM VPD, is received into the loader (22), which recognizes the native format of the machine reported configuration data. The loader determines the product type (e.g. iSeries server, zSeries server, printer, etc.), and decodes the data into individual data elements.

The translator (23) then employs translation tables and/or translation code appropriate to the recognized native format of the machine reported configuration data, such that common-format machine configuration data is produced, preferably in sales nomenclature including feature codes. This common-format machine configuration data is then stored in the MRPD database (18) until retrieved by a user.

The common-format machine configuration data is then retrieved when needed (e.g. when determining needed components for an upgrade or repair) by Machine-reported Report ("MRReport") function which applies additional translation tables and/or software code to produce a Configuration Report ("CFReport"), which contains the VPD information for the reporting machine in a human-readable format.

In a final stage of processing, the configuration report is reconciled (26) manually using tables, code and a user interface, to add or remove non-VPD enabled components (e.g. components in the system configuration which are known not to be able to report themselves either as installed or de-installed) to and from the configuration report. This yields a complete and accurate configuration of the system.

Figure 3:
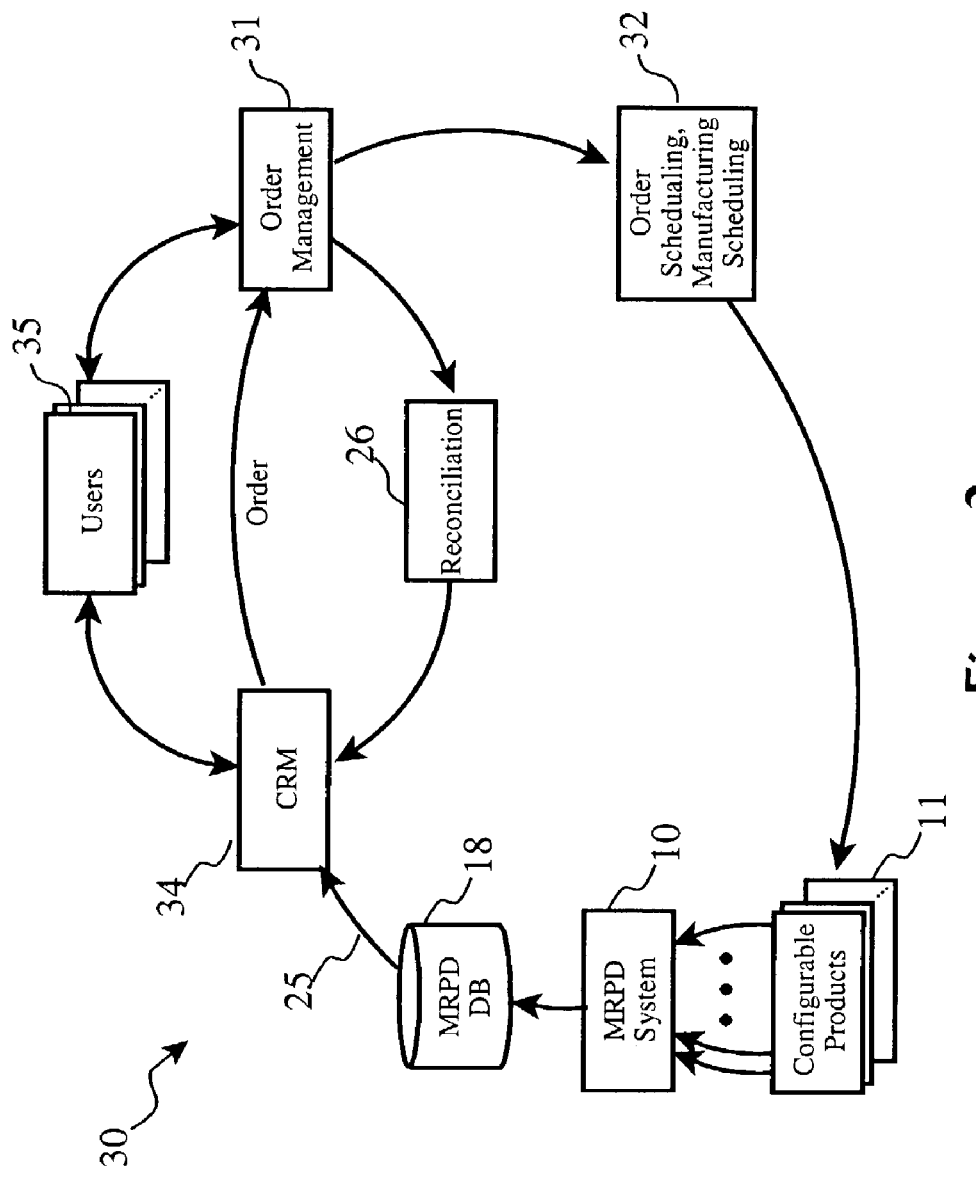
FIG. 3 depicts the usefulness of the related invention in conjunction with customer need and order fulfillment.

FIG. 3 illustrates the MRPD role in the overall order fulfillment process (30). Each configurable product (11) on command electronically reports its configuration data to the MRPD system (10), which processes the reported data as previously described, and stores the data into the MRPD database (18) in the common format (18). Using the configuration reports from the MRPD database (18), a customer relationship management ("CRM") system is employed to perform actual order generation (e.g. determining exactly what feature codes are needed to fulfill the customer need). CRM users (35) may access the order to perform manual configuration review, editing, and validation, and may submit the order to an order management system (31).

The order management system (31) then is used by manufacturing, testing and shipping departments to schedule and fulfill the customer's need or requirement. As shown in FIG. 3, additional reconciliation (25) of the system configuration to account for known discrepancies in the system configuration, if needed.

Figure 4:
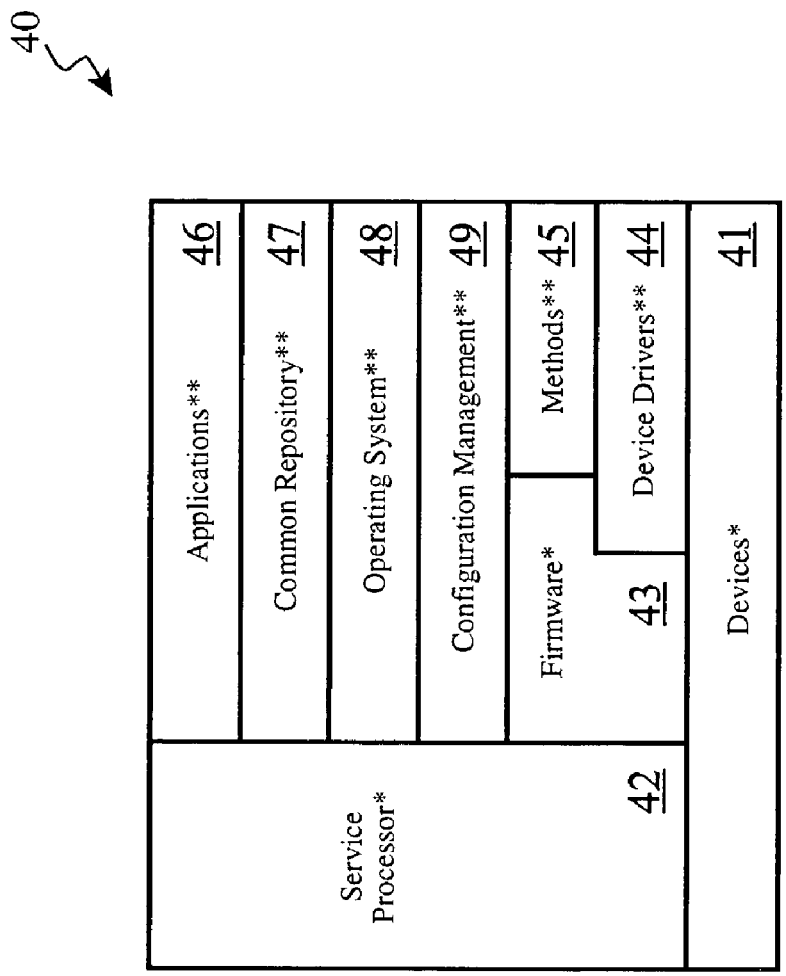
FIG. 4 provides details of a complex configurable system, such as a server computer, which is enabled to perform a self-inventory survey.

In FIG. 4, more details of a configurable product which is enabled to perform a self-inventory and report its configuration to our MRPD system. Such a system (40) comprises hardware-tracked and software-tracked device. Each component is ideally provided with the capability to be queried as to its part number, revision level, serial number, manufacturer, device ID, and Field Replaceable Unit ("FRU") number (e.g. slot number, bay number, etc.). This is typically done for hardware components by storing this information in a Read-only Memory ("ROM") on the device which is then either directly readable by system software or accessible via component firmware.

Software components such as application software, operating system components, device drivers, etc., are also preferably provided with an interface or function which allows an inventorying program to query their characteristics such as product name (e.g. AIX, OS/400, etc.), revision or release level, supplemental update/fix packs applied, options installed, etc.

So, as shown in FIG. 4, hardware-tracked components may include, but are not limited to:
(a) devices (41) such as network interface cards, add-in circuit cards and packs, peripheral interfaces, etc.;
(b) service processor (42) such as RISC processors, PowerPC processors, Intel Pentium processors, etc., including chipset components such as graphics and communications coprocessors, cache units, etc.; and
(c) firmware (43) such as functions embedded on cards and chips.

Additionally, software-tracking may be applied to configurable components including, but not limited to:
(d) device drivers (44);
(e) methods (45);
(f) configuration management utilities (49);
(g) operating system and OS components (48);
(h) repository products (47); and
(i) application programs (46).

Among the application programs (46) is at least one user-operable self-inventorying program which, upon invocation, queries all appropriately enabled system components, builds a report of the system configuration in a machine-native format, and communicates that report to the MRPD system. Some well-known existing self-inventory programs available on existing IBM configurable products, for example are "umic", "lscfg", "Inventory Scout", "WRKORDINF", etc.

Figure 5:
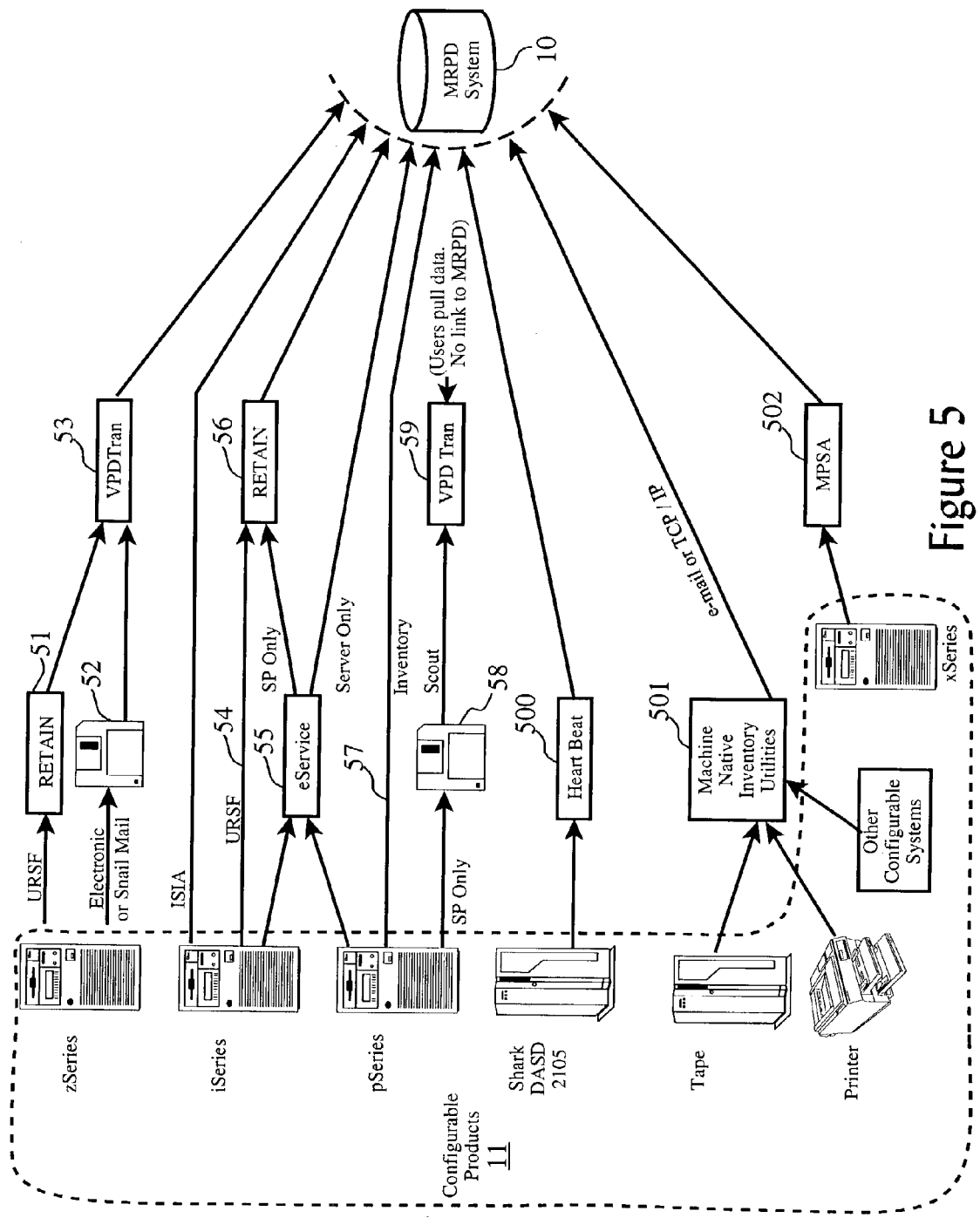
FIG. 5 illustrates the usefulness of the related invention with respect to the vast number of machine and system types which may be served by the invention.

Now, turning to FIG. 5, a view of the various methods, formats and protocols for collecting all the different machine configurations in all their different formats is shown. Some systems which are not enabled to communicate via a modem or computer network may report their configurations through an electronic file stored on a removable disk (52, 58) such as a floppy disk, or by administrator-attached files on electronic mail messages. Each of the acronyms and abbreviations (51–59, 500–502) shown in FIG. 5 are well-known and well-understood by users and administrators within the user community for each type of machine illustrated, such as Multi-Platform Service Agent ("MPSA") (502) for xSeries servers.

FIG. 5 is provided as an illustration of our MRPD system's ability to receive many different types of machine reported data, but not to indicate that any of these types of data is required by the MRPD system, and not to indicate that this set of machine report data types is the extent to which the MRPD system may be utilized.

Also as shown, electronic communication of the machine-native configuration report may be done by known computer communications schemes (e.g. TCP/IP, email, file transfer protocol, etc.), by physical storage transportation (e.g. "sneakernet"), or by proprietary methods, without departing from the scope of the invention.

The Present Invention in Detail: MRPDplus

The present invention, MRPDplus, provides a number of benefits to various processes including sales, manufacturing, and support of complex configurable systems, which include (a) improved business process and configuration data quality which drives reduced expenses, and (b) reduced order fulfillment cycle times which drives in increased customer satisfaction.

The best source for current configuration information of a customer installed system is to systematically obtain the hardware/software information needed from the machine. Enablement of the machine to survey its contents and provide the information, at the time the information is needed, is the best means for ensuring data accuracy. For this purpose, in our preferred embodiment, we have employed the MRPDclassic system and method of the related patent application.

The record strategy of our invention utilizes a data source that is external to the Order Process and the Manufacturing and Delivery System—the Customer's machine. This data, known as "Machine Reported Data", is stored in a single worldwide repository which we have named Machine Reported Product Data Base ("MRPDB"). Once established, these data records are used by both the Order Process and the Manufacturing and Delivery Systems, both in the legacy and in our re-engineered environments. This eliminates the need for the traditional human audited or operator generated inventory records.

A benefit of MRPDplus is that it provides a single reconciled output ("MRREPORT") of machine reported and non-machine reported data when a retrieval request for configuration data is initiated. In the legacy process, MRReports and CFReports were retrieved through several different methods, which varied by geography. Some geographical locations used only local sales records as their source for starting point input, others used files that had been stored by individuals. For example, within the United States geographical region, three separate data files were typically retrieved to determine a configuration starting point:
1. a Machine Report file from MRDB, a US-only database;
2. a base configuration report from an order installation and inventory upgrade database; and
3. an "On Order" report from an order installation and inventor upgrade database.

For example, for the S/390 product line, these three data files were typically submitted to the a Base Retrieval application program, which performed a merge/reconciliation of the data files to produce a single input to be processed by the configurator. This merge/reconciliation function occurred at the end users' client system.

MRPDplus provides, however, a single merged/reconciled MRReport for highly complex configurable systems such as IBM's S/390, AS400, RSserver, and various storage devices such as DASD, tape libraries, and printers. The present invention may be employed equally well to other types of configurable systems, including non-IBM systems, of course.

A profile data record is created for all machines that report Machine Reported Data to IBM, anywhere in the world.

Through coordinated and cooperative efforts between business process and application owners, as well as product development, manufacturing, and data management owners, an end-to-end integrated solution is provided by MRPDplus that is positioned to meet and exceed customer application and IBM business process needs. Enhancing a supplier's and manufacturer's business process effectiveness serves to minimize the total cost of system ownership, and to improve total customer satisfaction.

MRPDplus obtains its initial Machine Reported data inputs from initial manufacturing records or a Customer Installed system report. MRPDplus obtains non-MRD information from a variety of External Data Sources. When MRPDplus receives a request for configuration data, it merges and reconciles the Machine Reported and non-MRD information to produce a single reconciled output file.

This significantly minimizes the effort required as compared to traditional reconciliation within a Customer Relationship Management ("CRM") Order Process, and minimizes the human processing of the configuration data.

The MRPD data record preferrably has the following data sources:
1. Machine Reported Data—this is data obtained from the machine, either at the customer location, as built by manufacturing.
2. Non-Machine Reported Data—this is data obtained from the External Document Application and contains an order. Features that do not report electronically or cannot be Machine Reported, but that are orderable from the system supplier are contained within this data.
3. Customer Reported Data—this is data entered by the system supplier, representative or business partner. It represents features or devices which were not reported either through Machine Reported or Non-Machine Report data sources, but that are known to be installed on the Customer's machine.

It is important to note that within the MRPDB, Machine Reported Data should only be replaced or updated by a newly extracted set of Machine Reported Data from the Customer's machine. The Customer Reported Data entry process preferably includes manual input.

Non-Machine Reported Data is sent from the External Document Application and deposited on the MRPDB whenever an order is processed for a specific machine and the "install" transaction is processed.

Typically, customers will desire over time to increase computer capacity and function. IBM is unique in the method chosen to provide that increased capacity and function by using our "MES/upgrade" order process. However, this process requires starting point input data accuracy.

Other system suppliers choose to use a "box swap" order process methodology, wherein configuration information can be obtained manually from the initial system.

Using the present invention, a system supplier has an advantage as a systematic process of obtaining installed inventory information via utilization of Vital Product Data. This approach benefits over box swapping in the area of preserving a machine serial number as part of investment protection offerings. For high volume products within a manufacturers product line, VPD information is used. However, the volume of machines prohibit the collection, storage, and subsequent sharing of information. The VPD information is obtained on an engagement-to-engagement basis.

The first release of MRPDplus includes the ability to create starting point input in support of end users for MES processing of IBM iSeries and pSeries hardware, software, and peripherals. It supports US-geography orders submitted by IBM distributors, with MRPDclassic providing the installed machine VPD information if available. Each customer is responsible for transmitting VPD for eServer products (iSeries, pSeries and peripheral products).

MRPDplus also provides all critical information necessary for a business partner to submit defect-free, accurate configurations and orders while protecting all critical end user customer information (e.g. customer name, number, address, installed at, ship to, all non critical on order information) from unauthorized access to prohibit sales competition between business partners.

Figure 6:
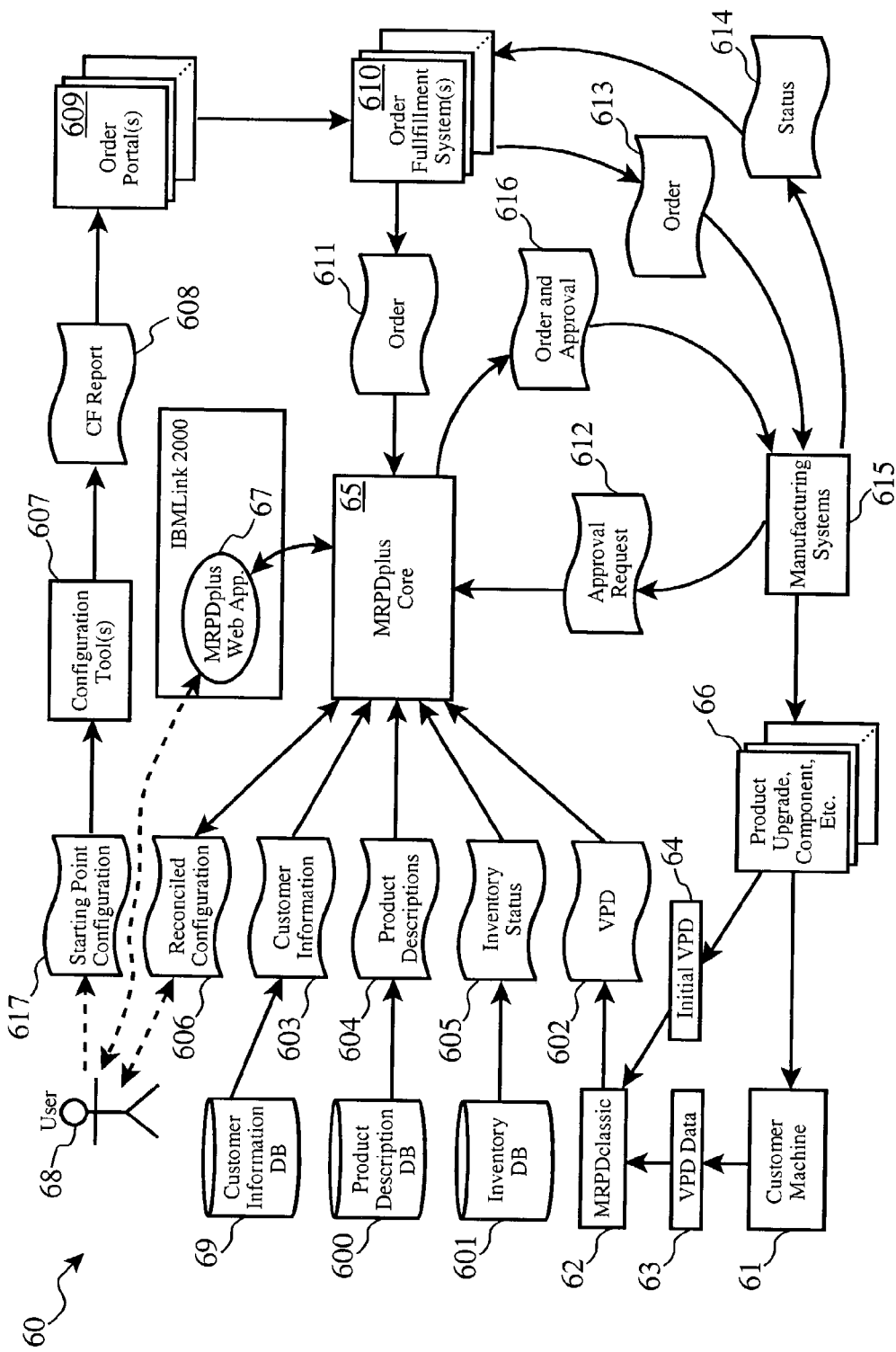
FIG. 6 shows one manner of use of the invention in a larger integration of systems.

Turning to FIG. 6, integration of MRPDplus within manufacturing, sales, and order fulfillment systems is shown from a system level. An installed customer machine (61), which is located remotely from the system supplier's or manufacturer's facilities, is initially to be repaired or upgraded such as a hardware upgrade or a software installation.

When the upgrade or repair order to a customer machine (61) is to be processed, a user (68) logs onto the MRPDplus web application program (67) from a suitable terminal such as a personal computer equipped with a web browser. The MRPDplus core (65) then pulls information from multiple sources about the subject machine (61).

MRPDclassic (62) is used to gather actual configuration information (63) as reported from the machine (61) itself, as well as the initial configuration information (64) according to the configuration of the machine at the time it was shipped and installed at the customer's site.

MRPDclassic (62) combines this information, as described previously and in the related patent application, and transmits (602) this information to the MRPDplus core (65). This information, however, may not be complete or accurate, as not all installed components on the customer's machine (61) may be enabled to inventory themselves, and as certain changes to the configuration may have been made since the initial shipping (66) and installation of the machine.

MRPDplus (65) also gathers relevant customer information (603) from one or more customer information database(s) (69), obtains updated product descriptions (604) from one or more product description database(s) (600), and retrieves inventory and configuration updates (605) from one or more inventory database(s) (601).

This information is consolidated, and transmitted (606) back to the user (68), who may then manually update the machine's configuration to be a correct reflection of the installed components, revision levels, etc. This provides an accurate starting point configuration (617) for making the repair or upgrade.

The user (68) then may make changes to the machine's configuration to reflect the desired upgrade or repair using a configuration tool (607), such as the IBM eConfig tool. This tool (607) outputs a "CFReport" (608):

(a) the starting point configuration (e.g. the accurate reflection of the current system configuration);

(b) an "order delta" (e.g the desired change to the configuration for an upgrade or repair); and (c) the desired "target" configuration (608).

In our preferred embodiment, the CFReport (608) is output in an eXtensible Markup Language ("XML") format, but alternate formats may be adopted equally well (e.g. text, binary, proprietary, etc.). Table 1 shows an example CFReport for further illustration, wherein a memory upgrade is desired for an installed computer.

TABLE 1

Example CFReport in pseudo-XML Format

```
<starting_point> /* current system configuration before changes */
    owner = "Big International Bank of Everywhere"
    chassis_serial_number = "ABC123"
    mfg_date = "01/01/2002"
    processor = "2 GHz Pentium IV"
    base_SDRAM = "256 MB"
    expansion_SDRAM = "size=256 MB, ser_no=KLM555,
        part_no=IBMXRAM256A"
    ...
</starting_point>
<config_delta> /* changes to be made to system */
    action(1) = "Remove expansion SDRAM"
    action(2) = "Install 1 GB expansion SDRAM module, IBM part
        number IBMXRAM1GB"
</config_delta>
<ending_point> /* desired configuration after upgrade/repair */
    owner = "Big International Bank of Everywhere"
    chassis_serial_number = "ABC123"
    mfg_date = "01/01/2002"
    processor = "2 GHz Pentium IV"
    base_SDRAM = "256 MB"
    expansion_SDRAM = "size=1 GB, ser_no=TBD,
        part_no=IBMXRAM1GB"
    ...
</ending_point>
```

Table 1 illustrates how the customer information, part numbers for each component, and the product descriptions are combined into a report format. Variations on this report format, of course, can be made without departing from the scope of the present invention, and this example format is presented for illustration purposes but does not represent the only format possible.

The CFReport and a format descriptor (608) are passed into one or more Order Portal systems (609). Some order portal systems, such as IBM's Business-to-Business ("B2B") Gateway or their legacy PC/S system, are designed especially for business partner use, while others such as IBM's SysLink system are designed for manufacturer-internal or systems-provider-internal use. In alternate embodiments, other order portal systems may be integrated easily through the use of the XML (or other open format) CFReport input.

The Order Portal(s) (609) produce actual orders (611), which are transmitted to an Order Fulfillment ("FF") system. The order (613) may then be passed directly into manufacturing systems (615), or it may be passed back to MRPDplus (65).

If the order is passed directly to the manufacturing system, then the manufacturing system may transmit the final order and final configuration to MRPDplus for final verification to make sure that exactly the right changes are going to be made to the targeted system (61). MRPDplus is able to compare the starting point configuration (617) to the configuration which is about to be implemented by manufacturing for correctness and completeness, thereby closing a very long loop through many systems and databases, and thereby catching any errors or omissions which may have occurred during processing the order. If the final configuration is correct and complete, an approval to proceed (616) is provided by MRPDplus (65) to the manufacturing systems (615), and the change is implemented (66) (e.g. the component or components are shipped, downloaded, etc.).

If the order (611) is submitted by the fulfillment system (610) directly to MRPDplus (65) first, then MRPDplus (65) will verify the final configuration, as just described, and then will provide manufacturing systems (615) with the final, verified correct configuration and approval (616) for implementation (66).

Figure 7:
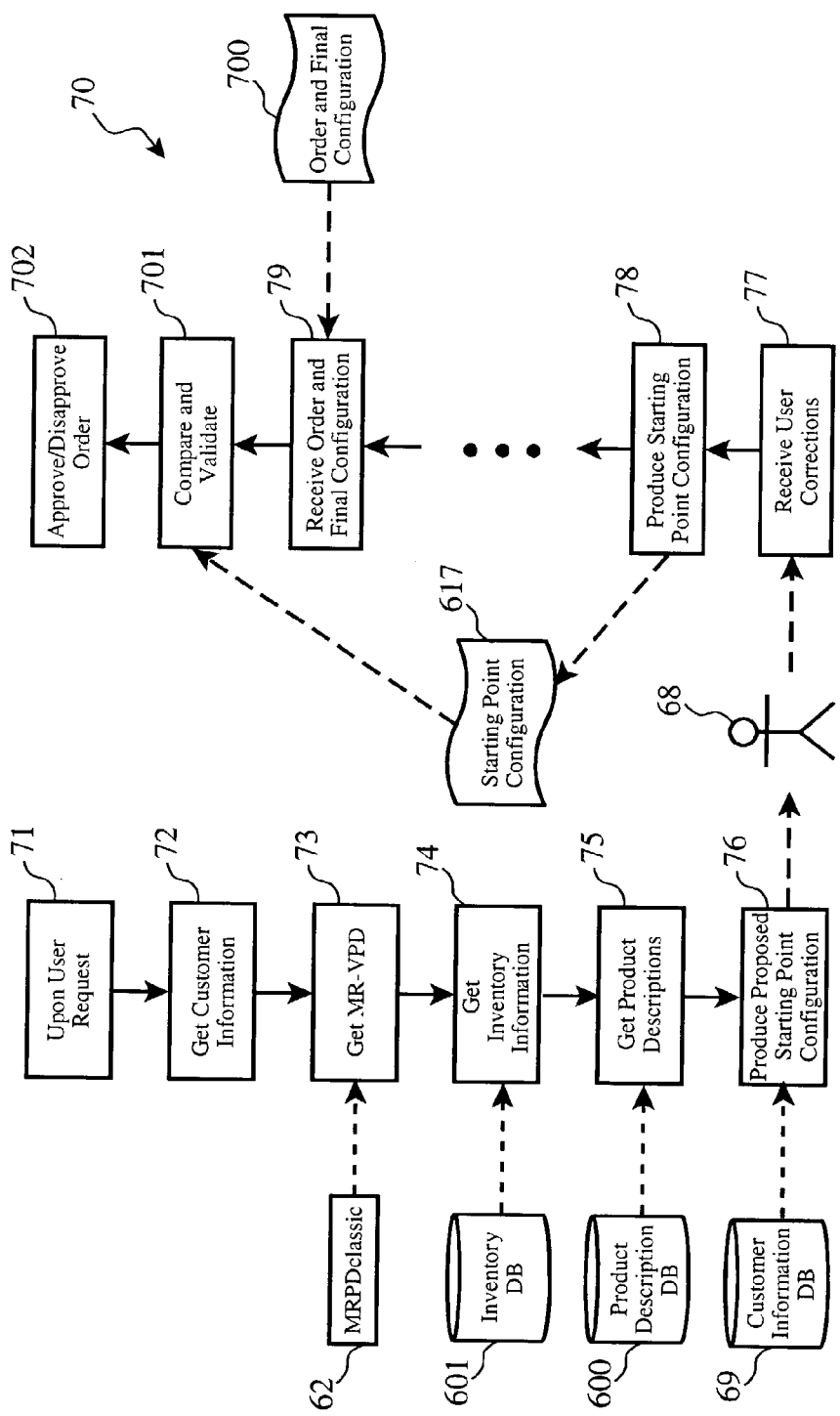
FIG. 7 details the logical methods of the present invention.

Turning to FIG. 7, the logical processes (70) of MRPDplus are illustrated in a general sense. Implementation of these processes is made using any suitable business logic technology, such as server and application scripts, JavaBeans, etc.

Upon the user's request (71) to place an order or repair request, MRPDplus will get the customer's information (72) from one or more customer information databases, poll the machine itself to get (73) the machine reported configuration information, and then gather the appropriate inventory and product description information (74, 75). It is important to note that the order of information gathering shown here is for illustration only, and that this information may be gathered in any alternate, suitable order.

After all of the information is gathered, a proposed starting point configuration is produced (76) and provided to the user (68). The user may review, accept, or modify the configuration, causing MRPDplus to receive (77) the corrections, and to produce (78) an accurate starting point configuration (617).

As previously discussed, this starting point configuration is the processed by other systems to generate a target configuration and a change description or change order. Further, other systems generate an actual order with final configuration (700), such as an order fulfillment system or manufacturing system, and this information is received (79) by MRPDplus for validation and verification (701). If the final configuration and order are correct and complete, the order can be approved (702), otherwise, it may be disapproved and resubmitted for further processing.

Conclusion

As will be recognized by those skilled in the art, many variations from the disclosed embodiment details may be made without departing from the spirit and scope of the present invention. For example, the present invention may be used to consolidate alternate sources of information regarding a complex configurable system's configuration, it may be implemented in conjunction with other application server environments, alternate manufacturing systems and order fulfillment systems.

What is claimed is:

1. A method for providing a single starting point configuration for a complex, configurable system, said method comprising the steps of:
   collecting machine-reported data from a configurable system;
   obtaining information regarding said configurable system from one or more document applications external to said configurable system;
   merging said machine-reported data and said external document application data to produce a proposed configuration starting point;
   providing a user-operable interface through which a user may enter one or more features, options, upgrades, or configuration changes to said proposed configuration starting point; and
   creating an actual starting point configuration according to said user-entered changes.

2. The method as set forth in claim 1 wherein said step of obtaining information from one or more external document applications comprises obtaining information from a Vital Product Data collection system.

3. The method as set forth in claim 1 wherein said step of obtaining information from one or more external document applications comprises obtaining information from a product description system.

4. The method as set forth in claim 1 wherein said step of obtaining information from one or more external document applications comprises obtaining information from an inventory database system.

5. The method as set forth in claim 1 wherein said step of obtaining information from one or more external document applications comprises obtaining information from a customer information system.

6. The method as set forth in claim 1 further comprising the steps of:
   receiving a system configuration change description;
   receiving a proposed final system configuration; and
   verifying that said system configuration changes applied to said accurate starting point configuration yields said proposed final system configuration.

7. An article of manufacture comprising:
   one or more computer-readable media suitable for storage of software;
   one or more software programs encoded on said computer-readable media for performing the steps of:
   (a) collecting machine-reported data from a configurable system;
   (b) obtaining information regarding said configurable system from one or more document applications external to said configurable system;
   (c) merging said machine-reported data and said external document application data to produce a proposed configuration starting point;
   (d) providing a user-operable, interface through which a user may enter one or more features, options, upgrades, or configuration changes to said proposed configuration starting point; and
   (e) creating an actual starting point configuration according to said user-entered changes.

8. The computer readable medium as set forth in claim 7 wherein said software for obtaining information from one or more external document applications comprises software for obtaining information from a Vital Product Data collection system.

9. The computer readable medium as set forth in claim 7 wherein said software for obtaining information from one or more external document applications comprises software for obtaining information from a product description system.

10. The computer readable medium as set forth in claim 7 wherein said software for obtaining information from one or more external document applications comprises software for obtaining information from an inventory database system.

11. The computer readable medium as set forth in claim 7 wherein said software for obtaining information from one or more external document applications comprises software for obtaining information from a customer information system.

12. The computer readable medium as set forth in claim 7 further comprising software for performing the steps of:
    receiving a system configuration change description;
    receiving a proposed final system configuration; and
    verifying that said system configuration changes applied to said accurate starting point configuration yields said proposed final system configuration.

13. A system for providing a single starting point configuration for a complex, configurable product, said system comprising:
    a vital product data collector configured to collect machine-reported data from a configurable system;
    a non-machine reported data collector configured to obtain information regarding said configurable system from one or more document applications external to the configurable system;
    a configuration information merger configured to merge said machine-reported data and said external document application data to produce a proposed configuration staffing point;
    a user-operable interface through which a user may enter one or more features, options, upgrades, or configuration changes to said proposed configuration starting point; and
    an actual starting point configuration creator configured to create an actual starting point configuration according to said user-entered changes.

14. The system as set forth in claim 13 wherein said non-machine reported data collector is configured to obtain information from a Vital Product Data collection system.

15. The system as set forth in claim 13 wherein said non-machine reported data collector is configured to obtain information from a product description system.

16. The system as set forth in claim 13 wherein said non-machine reported data collector is configured to obtain information from an inventory database system.

17. The system as set forth in claim 13 wherein said non-machine reported data collector is configured to obtain information from a customer information system.

18. The system as set forth in claim 13 further comprising:
    a system configuration change description receiver;
    a proposed final system configuration receiver; and
    a final configuration verifier configured to verify that said system configuration changes applied to said accurate starting point configuration yields said proposed final system configuration.

* * * * *